United States Patent [19]

Yamazaki

[11] Patent Number: 5,055,887
[45] Date of Patent: * Oct. 8, 1991

[54] FET WITH A SUPER LATTICE CHANNEL

[75] Inventor: Shunpei Yamazaki, Tokyo, Japan

[73] Assignee: Semiconductor Energy Laboratory Co., Ltd., Atsugi, Japan

[*] Notice: The portion of the term of this patent subsequent to Mar. 13, 2007 has been disclaimed.

[21] Appl. No.: 466,955

[22] Filed: Jan. 18, 1990

Related U.S. Application Data

[63] Continuation-in-part of Ser. No. 102,841, Sep. 30, 1987, Pat. No. 4,908,678.

[30] Foreign Application Priority Data

Oct. 8, 1986 [JP] Japan ............................. 61-240544
Oct. 8, 1986 [JP] Japan ............................. 61-240545
Oct. 8, 1986 [JP] Japan ............................. 61-240546

[51] Int. Cl.$^5$ .................... H01L 27/12; H01L 45/00; H01L 29/78
[52] U.S. Cl. ...................................... 357/4; 357/23.12
[58] Field of Search .................. 357/4, 23.12

[56] References Cited

U.S. PATENT DOCUMENTS 4,620,206 10/1986 Ohta et al. ........................... 357/4
4,794,611 12/1988 Hara et al. ........................... 372/45
4,908,678 3/1990 Yamazaki .

Primary Examiner—Jerome Jackson, Jr.
Assistant Examiner—Stephen D. Meier
Attorney, Agent, or Firm—Sixbey, Friedman, Leedom & Ferguson

[57] ABSTRACT

An improved FET is disclosed. The transistor is characterized in that its channel is in the form of a superlattice. The superlattice structure provides a number of square well potential areas through which carriers can pass with little interaction with the gate insulating film. The advantages of the superlattice structure are further enhanced by modifying the energy band structure to reduce carrier concentration near a gate insulating film.

6 Claims, 5 Drawing Sheets

FET WITH A SUPER LATTICE CHANNEL

REFERENCE TO RELATED APPLICATION

This is a continuation-in-part of application Ser. No. 102,841 filed Sept. 30, 19887, now U.S. Pat. No. 4,908,678.

BACKGROUND OF THE INVENTION

This invention relates to a field effect transistor (FET) provided with a superlattice channel.

Insulated gate field effect transistors (IGFET) are semiconductor devices which are suitable for highspeed switching operation. Such a transistor comprises a source region, a gate region, a drain region, each region being formed within a single-crystalline silicon semiconductor, and an electrode arrangement therefor. The source and drain regions are fabricated by ion doping by which the threshold voltage can be controlled.

In such a conventional structure, carrier flow in on-state is limited to a very thin region contiguous to the gate insulated film, so that the mobilities of the electron and the hole are only about $300 cm^2 V/sec$ and $150 cm^2 V/sec$ due to interfacial scattering. furthermore, in the way of seeking high density of integrated circuits, a short channel length is desired and therefore the concentration of carriers must be made high. Because of this, the mobilities again become low.

SUMMARY OF THE INVENTION

It is therefore an object of the invention to provide a gate insulated FET suitable for application to high speed switching.

It is another object of the invention to provide a gate insulating FET in which punch through breakdown is not likely.

In order to accomplish the above objects, according to the invention, a superlattice structure is formed below a gate insulating film as a channel region. In this structure, carriers pass through a plurality of wells (in the form of sequential square well potentials) so that the carriers are little affected from the interface between the channel region and the gate insulating film. Because of this, even though the channel is made from a substantially intrinsic semiconductor, the curvature of the energy band is comparative to that made of a conventional impurity semiconductor.

DETAILED DESCRIPTION OF THE PREFERRED EMBODIMENT

Figure 1A:
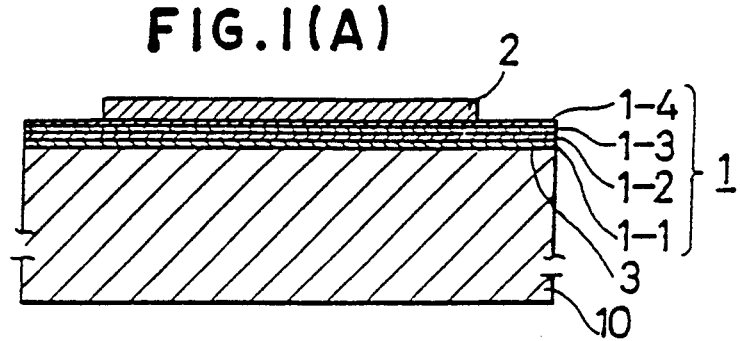
FIGS. 1(A) through 1(D) are cross-sectional views showing the process of a gate insulating FET in accordance with the present invention.
Figure 1B:
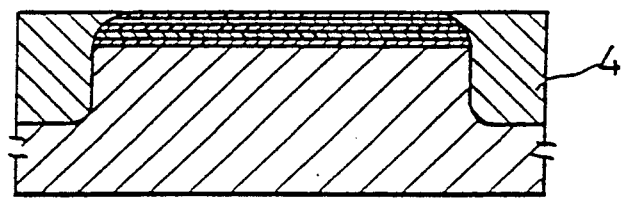
Figure 1C:
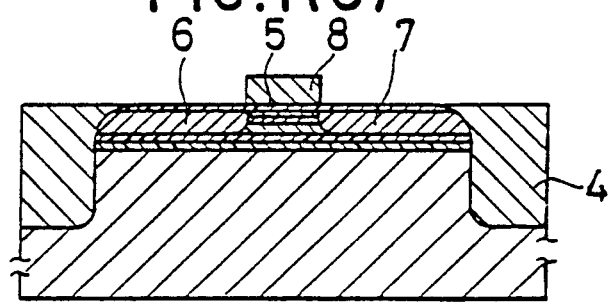

Referring to FIGS. 1(A) through 1(D), a gate insulated FET is explained according to its manufacturing method. On a single-crystalline silicon semiconductor substrate whose upper surface is sufficiently cleaned, 25Å thick silicon semiconductor film and 25Å tick silicon nitride ($Si_3N_{4-x}$ $0 < X < 1$) film are deposited in turn so that the two kinds of films are superimposed one on another for 2–50 times in a superlattice structure. The deposition is carried out with "hv-1", the trademark of a photo enhanced CVD apparatus distributed by Semiconductor Energy Laboratory Co., Ltd. Namely, disilan gas is introduced into a reaction chamber at 10 Torr and irradiated with ultraviolet light (185nm in wavelength) emitted from a low pressure mercury lamp, whereupon a 25Å thick silicon semiconductor film is deposited on the substrate which is heated to 200°–500° C., e.g., 400° C. Then, under the control of a microcomputer, a mixture gas, $NH_3/Si_2H_6 = 0.1–1.0$ (e.g., 0.3), is introduced into the reaction chamber and processed in the same manner so that a silicon nitride film is deposited with 25Å in thickness. The thickness of the silicon nitride film may be chosen from between 10–100Å (e.g., 25Å). The deposition is carried out repeatedly and a superlattice structure is fabricated. Next, the superlattice 1 formed within the substrate 10 is annealed with nitrogen laser beam in nitrogen atmosphere. By this annealing, the semiconductor films 1-1, 1-3, ... 1-n are crystallized into single crystalline layers by virtue of the single crystalline structure of the substrate 10. The silicon nitride film 1-2, 1-4, ... 1-(n-1) are crystallized into single crystalline layers, distorted crystalline layers, or non-single-crystalline layers, depending on the proportion of nitrogen to silicon.

On the superlattice 1, a mask is placed, and the lattice and the substrate 10 is partially removed by anisotropic etching. An insulating material 4 is deposited into the etched portions by an existing method which is used for forming a trench structure. After taking out the mask 2, a gate insulating film 5 and a gate electrode are formed. The gate insulating film is formed of silicon oxide by a photo enhanced CVD. the gate electrode is made of $WSi_2$, $TiSi_2$, or a semiconductor-metal multi-layer structure.

Then, a source region 6 and a drain region 7 are formed by ion implantation. The impurity densities of the source and drain regions are about $10^{17}-10^{19} cm^{-3}$. The interfaces of these regions 6 and 7 adjacent to the superlattice 1 are desired normal to the principal surface. Over the source and drain regions 6 and 7 and the gate electrode 5, a silicon oxide layer is deposited on the substrate with 0.5 micron in thickness by a photo CVD using $SiH_4$ and $O_2$. The silicon oxide layer is anisotropically etched and removed by electron cyclotron resonance. except for the portion 9 on the peripheral side surface of the gate electrode 8.

Further, regions 6' and 7' for providing ohmic contacts and for making the sheet resistance of the source and the drain low are formed by a high density ion implantation at $1 \times 10^{19} - 2 \times 10^{20} cm^{-3}$, followed by thermal annealing. After covering the upper surface with an insulating layer 13, a source electrode 11 and a drain electrode 12 are formed in contact with the source contact region 6' and the drain contact region 7' through openings formed on the insulating layer 13. The electrodes 11 and 12 are formed of an aluminum layer by a known method. The channel length of the FET thus formed is one micron.

The characteristics of a FET which had been manufactured by the above explained method with such doping levels that are required for controlling the threshold voltage were measured. As a result, no punch through was observed, even when 5V was applied between the source and the drain. The carrier mobility calculated in accordance with the C. T. Sah's formula was 750 cm$^2$V/sec. This figure is 2.5 times as large as the conventional figure, 300 cm$^2$V/sec. The improved mobility is supposed to increase yet as the crystallinity of the superlattice is improved.

Figure 1D:
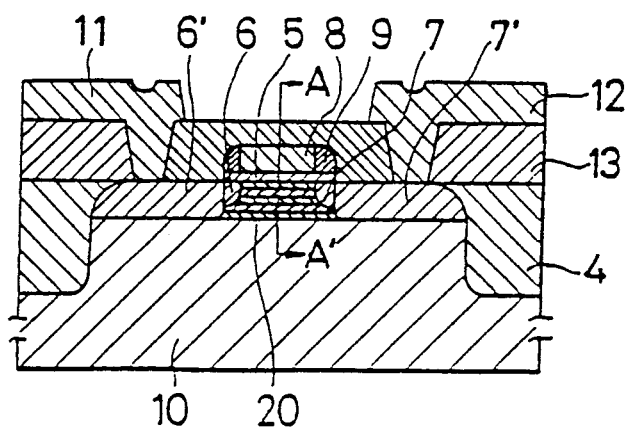
Figure 2A:
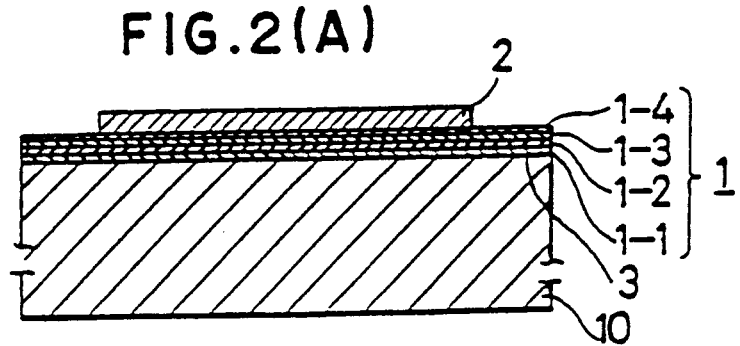
FIGS. 2(A) through 2(D) are cross-sectional views showing the process of another embodiment of the present invention.
Figure 2B:
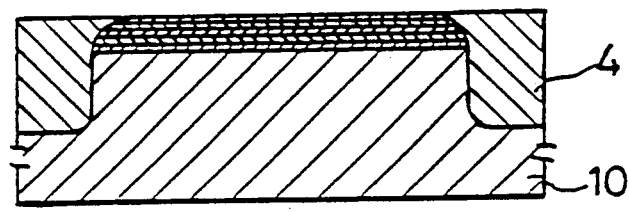
Figure 2C:
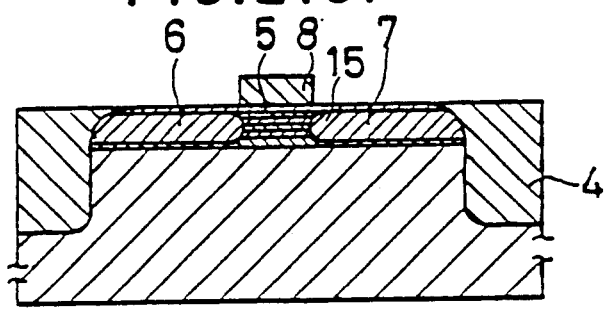
Figure 2D:
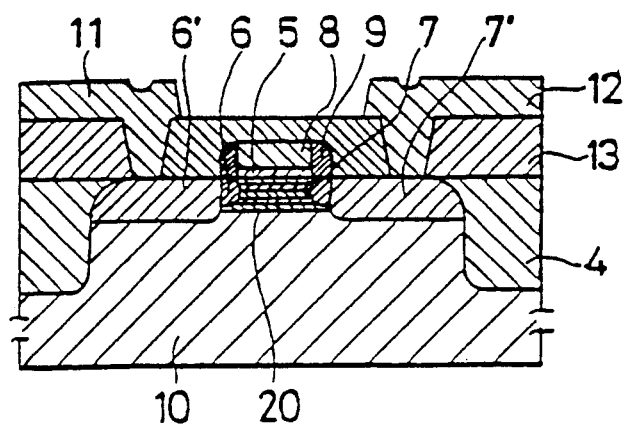
Figure 3A:
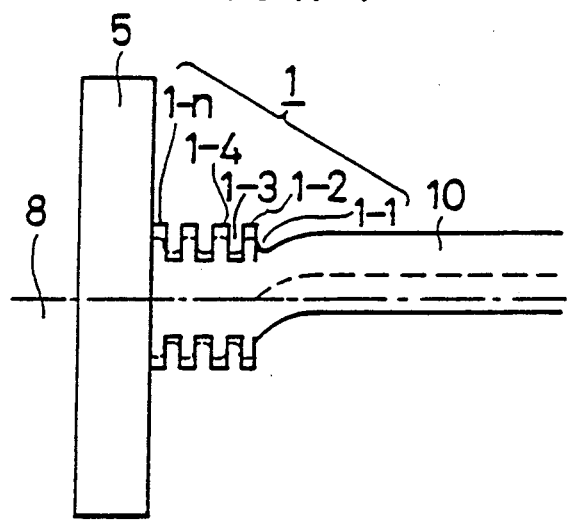
FIGS. 3(A) and 3(B) are energy band diagrams for a gate insulating FET in accordance with the present invention.
Figure 3B:
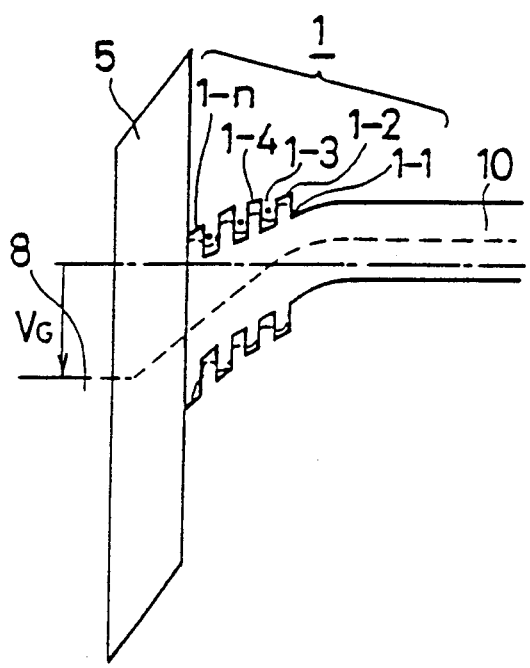

FIGS. 3(A and 3(B) are energy diagrams taken across the A—A' line of FIG. 1(D) showing energy bands of the device formed in accordance with the above method. As seen from FIG. 3(A), there are a number of regions, apart from the gate insulating film 5, where carriers flock and can exist stably. Although the diagram is changed under a gate voltage $V_G$, the carrier passages remain apart from the gate insulating film as illustrated in FIG. 3(B). Namely, concentrations of carriers near the region contiguous to the insulating film 5 are avoided.

Referring to FIGS. 2(A) through 2(D), a second embodiment is illustrated. Insofar as Figures, FIGS. 2(A) and 2(B) and corresponding description are the same as the preceding embodiment, no redundant explanation is repeated. In this embodiment, source and drain regions 6 and 7 are formed so that the impurity density is higher at a deeper position. Because of this, the channel length between the source and the drain becomes longer as the gate insulating film 5 is approached, and the carrier can drift easily at an inner region as compared with a shallow region so that the influence of interfacial diffusion is reduced. The carrier mobility was improved to 850cm$^2$V/sec. The other manufacturing conditions are the same as in the preceding embodiment.

A third embodiment is directed to another forming method of such devices as illustrated in FIGS. 1(A) to 1(D) or in FIGS. 2(A) to 2(D). The superlattice 1 is fabricated by photo epitaxial growth. Namely, with the same apparatus used for the first embodiment, Si$_2$H$_6$ and H$_2$SiF$_2$ are introduced into the reaction chamber at almost the same rate. In addition, hydrogen gas is introduced at a rate 20 times as high as that of Si$_2$H$_6$. The substrate temperature is 500° C. The reaction pressure is 10 Torr. Other processes are the same as those of the first embodiment. Photo CVD and photo epitaxial growth are excellent in forming thin films with 5-100A, e.g., 10-30A repeatedly without damaging underlying surfaces.

The advantages brought by the superlattice structure in accordance with the present invention are further enhanced by modifying the energy band structure in order to reduce the carrier concentration near the gate insulating film. This can be accomplished by varying the thicknesses and/or the band widths of the respective films constituting the superlattice.

Figure 4A:
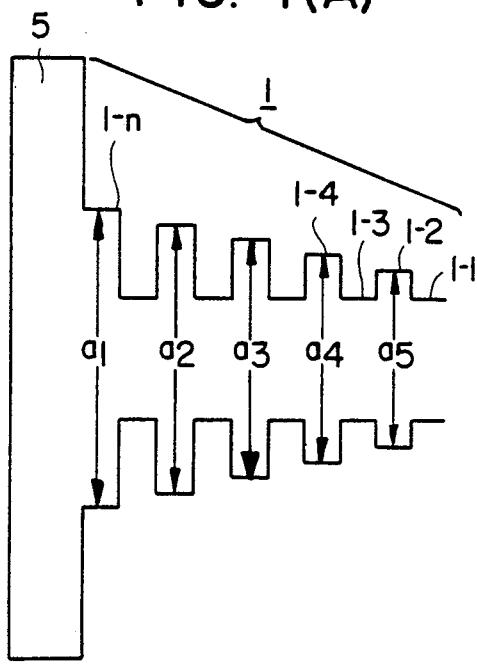
FIGS. 4(A) through 4(E) are energy band diagrams of a gate insulating FET in accordance with another embodiment of the present invention.

In FIG. 4(A), silicon nitride insulating films (Si$_3$N$_{4-x}$) and silicon semiconductor films are formed in turn with a varying introduction ratio of nitride. The energy width of the silicon nitride film aid decreases as it departs from the gate insulating film. Namely, $a_1 > a_2 > a_3 > \ldots$ as depicted in the figure. The control of the energy band width is accomplished by changing the introduction ratios of saline and ammonia in a deposition chamber.

Figure 4B:
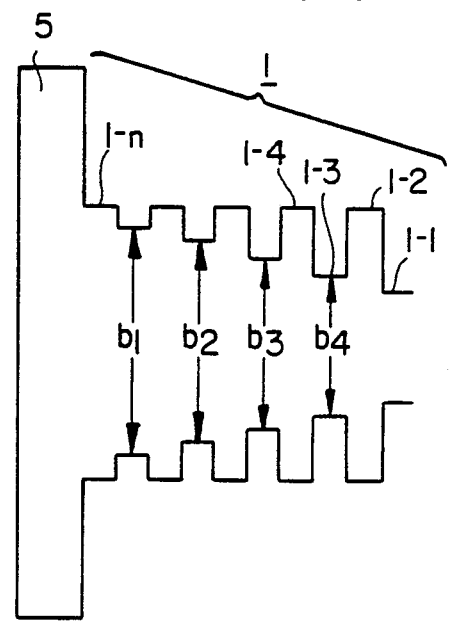

Conversely, the energy band widths of the semiconductor films can be varied. Si$_3$N$_4$ semiconductor and SiC$_{1-x}$ semiconductor films are formed in turn in FIG. 4(B). The parameter x is increased so that the band width of the SiC$_{1-x}$ film is wider at a position nearer to the gate insulating film. Namely, $b_1 > b_2 > b_3 \ldots$ as shown in FIG. 4(B).

Figure 4C:
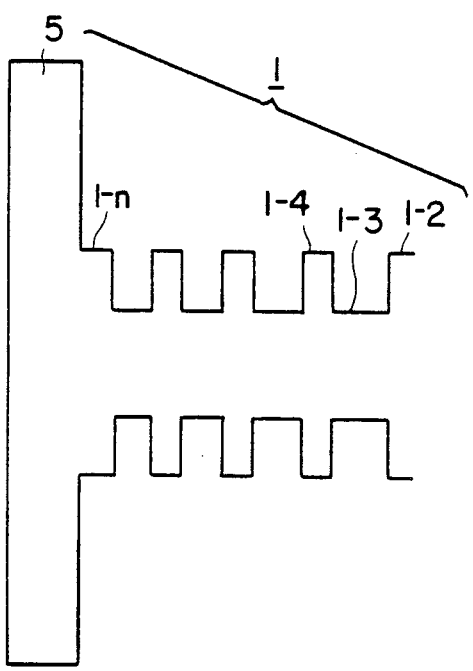
Figure 4D:
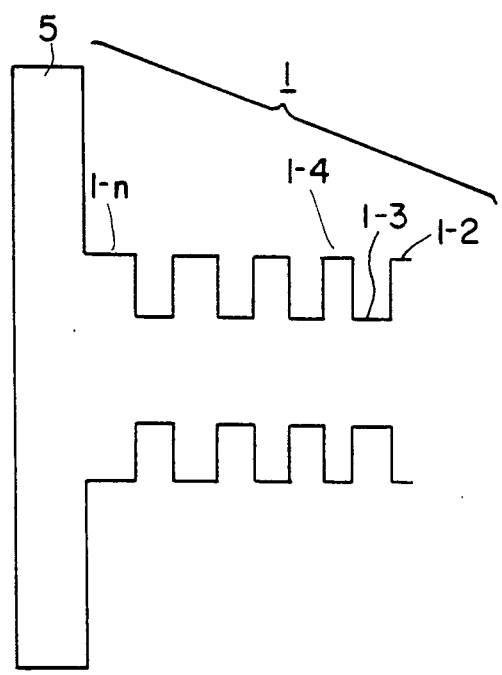
Figure 4E:
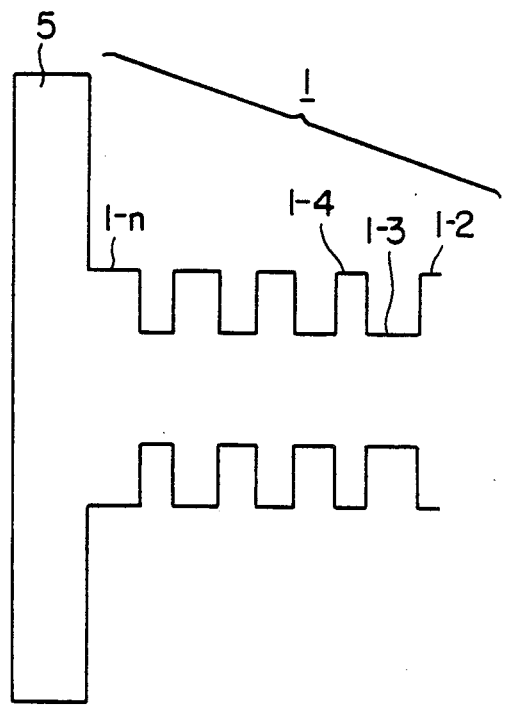

The thickness of the constituent films can be varied in place of the band width. In the embodiments illustrated in FIGS. 4(C) to 4(D), silicon nitride films and silicon semiconductor films are formed in turn. In FIG. 4(C), the thickness of the silicon semiconductor film is gradually decreased toward the insulating film. In FIG. 4(D), the thickness of the silicon nitride film is gradually increased toward the insulating film. In FIG. 4(E), the thickness of the silicon semiconductor film is gradually decreased while the thickness of the silicon nitride film is gradually increased toward the insulating film.

Figure 5:
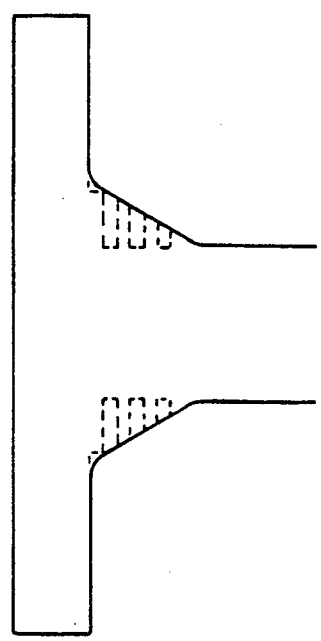
FIG. 5 is an energy band diagram of the ideal energy band configuration.

In any embodiment of the modifications, the energy band structure is modified so that the carrier density is decreased at a position near the gate insulating film and carriers can flow free from the interference of the interface of the gate region and the gate insulating film. By the nonuse of the vicinity of the interface the undesirable influence of the interface can be avoided. From the concept, the ideal energy band configuration is as depicted in FIG. 5. A slopped edge is formed at the interface. The configuration, however, cannot be utilized in practice because when this sloped configuration is formed there are inevitably formed a number of discrete states in the slopped configuration. The discrete states cause an undesirable current which is substantially scattered. When a similar structure as illustrated by broken line is formed, there are formed a few such undesirable states. The dimensional differences between FIGS. 4(A) to 4(E) and FIG. 5 are attributed only for the purposes of illustration but do not reflect the actual differences.

The invention should not be limited to the above particular embodiments and many modifications and variations may be obvious to those skilled in the art. For example, in place of silicon nitride films, SiO$_{2-x}$ ($0 < X < 0$) or Si$_x$C$_{1-x}$ ($0 < X < 1$) can be used.

I claim:

1. A gate insulated field effect transistor comprising:
   a source region formed within a semiconductor substrate;
   a drain region formed within said semiconductor substrate apart from said source region;
   a channel region located between said source and drain regions and formed in superlattice structure comprising insulator and semiconductor films which are stacked in turn;
   a gate insulating film formed on said channel region; and
   gate, source and drain electrodes making electrical contact with said channel, source and drain regions respectively,
   wherein the energy band width of the said insulator film near to said gate insulating film is larger than that of the said insulator film located more apart from said gate insulating film.

2. The transistor of claim 1, wherein said insulator films are made of Si$_3$N$_{4-x}$ and the differential energy band widths of said insulator films are attributed to the differences in the parameter x.

3. A gate insulated field effect transistor comprising:
   a source region formed within a semiconductor substrate;
   a drain region formed within said semiconductor substrate apart from said source region;

a channel region located between said source and drain regions and formed in superlattice structure comprising insulator and semiconductor films which are stacked in turn;

a gate insulating film formed on said channel region; and gate, source and drain electrodes making electrical contact with said channel, source and drain regions respectively, wherein the energy band width of the said semi-conductor film near to said insulating film is wider than that of the said semiconductor film located more apart from said gate insulating film.

4. The transistor of claim 1, wherein said semiconductor films are made of $SiC_{1-x}$ and the differential energy band widths of said semiconductor films are attributed to the differences in the parameter x.

5. A gate insulated field effect transistor comprising:

a source region formed within a semiconductor substrate;

a drain region formed within said semiconductor substrate apart from said source region;

a channel region located between said source and drain regions and formed in superlattice structure comprising insulator and semiconductor films which are stacked in turn;

a gate insulating film formed on said channel region; and gate, source and drain electrodes making electrical contact with said channel, source and drain regions respectively, wherein the said insulator film near to said insulating film is thicker than the said insulator film located more apart from said gate insulating film.

6. A gate insulated field effect transistor comprising:

a source region formed within a semiconductor substrate;

a drain region formed within said semiconductor substrate apart from said source region;

a channel region located between said source and drain regions and formed in superlattice structure comprising insulator and semiconductor films which are stacked in turn;

a gate insulating film formed on said channel region; and gate, source and drain electrodes making electrical contact with said channel, source and drain regions respectively, wherein the said semiconductor film near to said insulating film is thinner than that of said semiconductor film located more apart from said gate insulating film.

* * * * *